United States Patent [19]
Yamamoto

[11] Patent Number: 5,499,216
[45] Date of Patent: Mar. 12, 1996

[54] SEMICONDUCTOR MEMORY DEVICE SELECTIVELY OPERATING DIVIDED MEMORY BLOCKS

[75] Inventor: Kouji Yamamoto, Hyogo, Japan

[73] Assignee: Mitsubishi Denki Kabushiki Kaisha, Tokyo, Japan

[21] Appl. No.: 409,575

[22] Filed: Mar. 24, 1995

[30] Foreign Application Priority Data

Mar. 30, 1994 [JP] Japan ................... 6-061525

[51] Int. Cl.⁶ .................................. G11C 8/00
[52] U.S. Cl. ............... 365/230.03; 365/230.04; 365/230.06; 365/203; 365/149
[58] Field of Search ............... 365/230.03, 149, 365/203, 202, 207, 230.04, 230.06

[56] References Cited

U.S. PATENT DOCUMENTS 4,825,418  4/1989  Itoh et al. .................. 365/207
5,321,657  6/1994  Arimoto et al. ............ 365/230.03 X

*Primary Examiner*—David C. Nelms
*Assistant Examiner*—Huan Hoang
*Attorney, Agent, or Firm*—Lowe, Price, LeBlanc & Becker

[57] ABSTRACT

A sub row selector is provided in addition to a row selector in a semiconductor memory device selectively operating a plurality of divided memory blocks. A selector of the sub row selector generates a sub row select signal for connecting a bit line pair corresponding to a selected row address and an input/output data line pair in a selected memory block in response to a memory block select signal and a corresponding row select signal. Therefore, only in a selected memory block, a bit line pair corresponding to the selected row address and the input/output data line are connected. As a result, it is possible to selectively operate memory blocks divided in plural with a potential difference between the initial charge potential of each bit line pair and the initial charge potential of each input/output data line pair in a non-selected memory block.

11 Claims, 6 Drawing Sheets

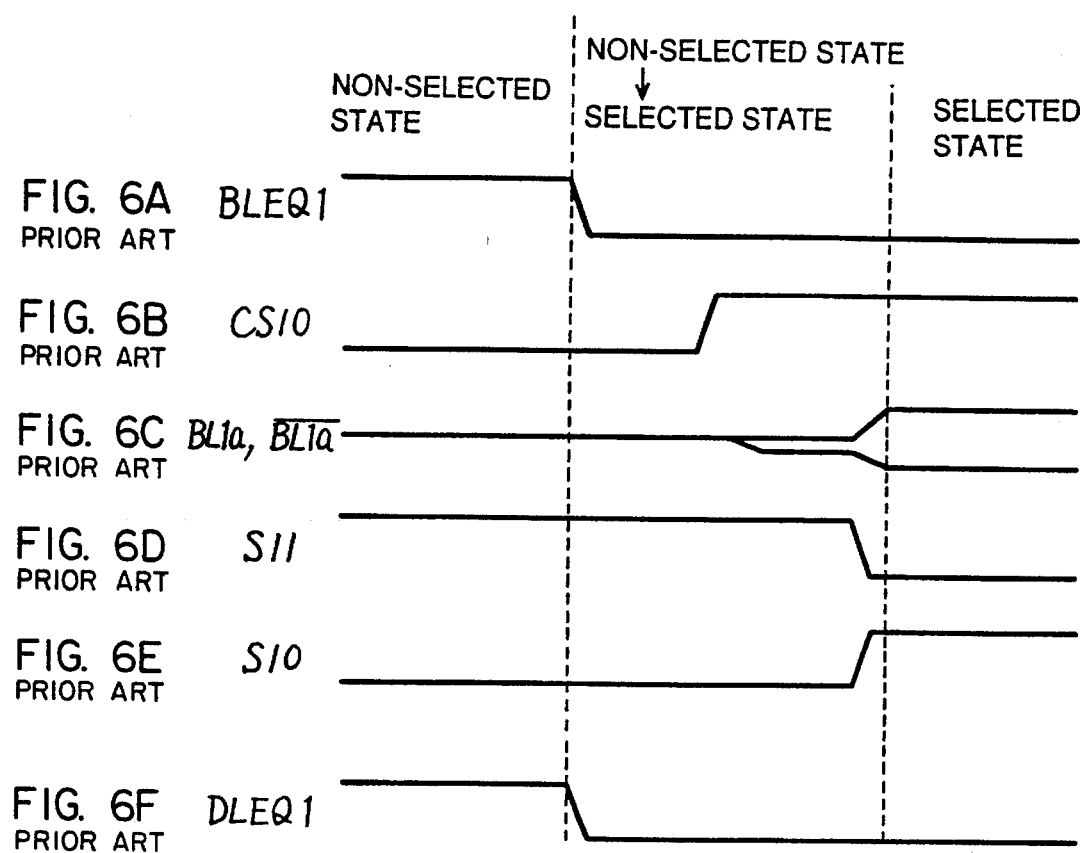

SEMICONDUCTOR MEMORY DEVICE SELECTIVELY OPERATING DIVIDED MEMORY BLOCKS

BACKGROUND OF THE INVENTION

1. Field of the Invention

The present invention relates to semiconductor memory devices, and more particularly, to a semiconductor memory device selectively operating a plurality of divided memory blocks.

2. Description of the Background Art

FIG. 4 is a block diagram of a circuit showing a configuration of a conventional dynamic random access memory (hereinafter referred to as a "DRAM").

In FIG. 4, shown are two divided memory blocks 1 and 2 which are operated selectively, and a row selector 8 selecting respective row addresses of these memory blocks 1 and 2. Either memory block 1 or 2 is activated in response to an external address input.

Memory block 1 includes a plurality of memory cell arrays 1a–1c . . . , a plurality of bit line pairs BL1a, $\overline{BL1a}$–BL1c, $\overline{BL1c}$ . . . , an input/output data line pair BUS1, $\overline{BUS1}$, and a plurality of transfer gate transistors (each hereinafter referred to as a "transistor") 3a–3c . . . , 4a–4c . . . , 71 and 72.

Memory block 2 includes a plurality of memory cell arrays 2a–2c . . . , a plurality of bit line pairs BL2a, $\overline{BL2a}$–BL2c, $\overline{BL2c}$, an input/output data line pair BUS2, $\overline{BUS2}$ and a plurality of transfer gate transistors (each hereinafter referred to as a "transistor") 5a–5c . . . , 6a–6c . . . , 73 and 74.

Since memory block 1 and memory block 2 are the same in configuration, description will be given of memory block 1 as an example.

Each of memory cell arrays 1a–1c . . . receives a bit line pair equalize signal BLEQ1, column select signals CS10–CS1N, and sense signals S10, S11, and operates in response to these signals.

Bit line pair equalize signal BLEQ1 brings paired bit lines provided in each of memory cell arrays 1a–1c . . . to the same potential when memory block 1 is in a non-selected state. Column select signals CS10–CS1N specify a column address corresponding to an external address input.

Sense signals S10, S11 amplify data of the column address specified by column select signals CS10–CS1N in each of memory cell arrays 1a–1c . . .

Memory cell arrays 1a–1c . . . are provided with bit line pairs BL1a, $\overline{BL1a}$–BL1c, $\overline{BL1c}$ . . . , respectively. Input/output data line pair BUS1, $\overline{BUS1}$ is for input/output of data between memory cell arrays 1a–1c . . . and the outside world.

Bit lines BL1a–BL1c . . . are connected to input/output data line BUS1 through transistors 3a–3c . . . , respectively. Bit lines $\overline{BL1a}$–$\overline{BL1c}$ . . . are connected to input/output data line $\overline{BUS1}$ through transistors 4a–4c . . . , respectively.

Input/output data line BUS1 is supplied with an internally generated Voltage V1 through transistors 71 and 72. Input/output data line $\overline{BUS1}$ is supplied with internally generated voltage V1 through transistor 71. The internally generated voltage V1 determines respective initial charge potentials of input/output data lines BUS1, $\overline{BUS1}$.

Transistors 71 and 72 receive a data line pair equalize signal DLEQ1 at their gates. The data line pair equalize signal DLEQ1 brings input/output data lines BUS1, $\overline{BUS1}$ to the same potential when memory block 1 is in a non-selected state.

Row selector 8 generates row select signals RSa–RSc . . . for selecting a row address in response to an external address input. Row select signals RSa–RSc . . . correspond to respective row addresses of memory cell arrays 1a–1c . .

Transistors 3a and 4a receive row select signal RSa at their gates. Transistor 3b and 4b receive row select signal RSb at their gates. Transistor 3c and 4c receive row select signal RSc at their gates.

As described above, memory block 2 is configured similar to memory block 1. Therefore, each of memory cell arrays 2a–2c receives a bit line pair equalize signal BLEQ2, column select signals CS20–CS2N, and sense signals S20, S21.

Transistors 73 and 74 receive an input/output data line pair equalize signal DLEQ2 at their gates.

Transistors 5a and 6a receive row select signal RSa at their gates. Transistors 5b and 6b receive row select signal RSb at their gates. Transistors 5c and 6c receive row select signal RSc at their gates.

Description will now be given of configuration of memory cell arrays 1a–1c . . . and 2a–2c . . . Since these memory cell arrays are the same in configuration, memory cell array 1a will be described as a representative example. In FIG. 5, the same portions as those of FIG. 4 are labeled with the same reference characters, and the description will not be repeated.

Referring to FIG. 5, the memory cell array includes a sense amplifier circuit SA, a memory portion M and an equalize circuit EQ.

Sense amplifier circuit SA includes three N channel transistors 26a–26c, and three P channel transistors 27a–27c. These transistors are provided between a power supply node N1 receiving power supply potential and a ground node N2 receiving ground potential, and between bit lines BL1a and $\overline{BL1a}$.

Sense amplifier circuit SA receives sense signal S10 at the gate of transistor 26c, and sense signal S11 at the gate of transistor 27c. Sense amplifier circuit SA operates in response to sense signals S11 and S10, and amplifies the potential difference between bit lines BL1a and $\overline{BL1a}$.

Memory portion M includes a plurality of memory cells MC0, MC1 . . . Each of memory cells MC0, MC1 . . . includes a capacitor and a transfer gate transistor (hereinafter referred to as a "transistor").

Each capacitor holds written electric charge in its capacity. Capacitors 28a, 28b . . . of memory cells MC0, MC1 . . . are connected to bit line $\overline{BL1a}$ or BL1a through corresponding transistors 29a, 29b . . . , respectively.

Capacitor 28a of memory cell MC0 is, for example, connected to bit line $\overline{BL1a}$ through transistor 29a. Capacitor 28b of memory cell MC1 is connected to bit line BL1a through transistor 29b.

Respective transistors 28a, 28b . . . of memory cells MC0, MC1 . . . receive corresponding column select signals CS10, CS11 . . . at their gates for operation.

Equalize circuit EQ includes transfer gate transistors 30a, 30b and 30c. Transistors 30a and 30b are connected in series between bit lines BL1a and $\overline{BL1a}$. A node between transistors 30a and 30b is supplied with an internally generated voltage V2. The internally generated voltage V2 determines initial charge potentials of bit lines BL1a and $\overline{BL1a}$.

Transistor 30c is connected between bit lines BL1a and $\overline{BL1a}$. Transistors 30a–30c receive bit line equalize signal BLEQ1 at their gates for operation.

Operation of memory blocks 1 and 2 shown in FIGS. 4 and 5 will now be described. Memory block 1 is taken here as an example. In the following description, the cases where memory block 1 is in a non-selected state and in a selected state are described separately.

FIG. 6 is a timing chart showing operation of memory block 1 of the conventional DRAM shown in FIG. 4. Operation will be described here with reference to FIGS. 4 to 6.

[The case where memory block is not selected]

When memory block 1 is not selected, bit line pair equalize signal BLEQ1 of memory block 1 is brought to a logical high or H level. As a result, transistors 30a–30c of equalize circuit EQ in each of all memory cell arrays 1a–1c . . . configuring memory block 1 are turned on.

Consequently, bit line pair BL1a, $\overline{BL1a}$ is short-circuited by transistor 30c, and bit lines BL1a, $\overline{BL1a}$ attain the same potential.

Simultaneously, electric charge from internally generated voltage V2 is transmitted to bit lines BL1a, $\overline{BL1a}$ through transistors 30a and 30b, respectively. As a result, bit lines BL1a, $\overline{BL1a}$ are initially charged.

Similarly, data line pair equalize signal DLEQ2 is brought to the H level, and transistors 71 and 72 are turned on. As a result, input/output data lines BUS1, $\overline{BUS1}$ are initially charged by internally generated voltage V1.

[The case where memory block is selected]

When memory block 1 is selected in response to an external address input, bit line pair equalize signal BLEQ1 of memory block 1 is brought to a logical low or L level. As a result, transistors 30a–30c of equalize circuit EQ in each of all memory cell arrays 1a–1c . . . configuring memory block 1 are turned off.

Consequently, in memory cell array 1a, for example, bit line pair BL1a, $\overline{BL1a}$ is not supplied with internally generated voltage V2. As a result, bit line pair BL1a, $\overline{BL1a}$ is brought to a complete floating state wherein the bit line pair is not supplied with electric charge at all. The same operation is carried out in each of the other memory cell arrays 1b, 1c . . .

Similarly, data line pair equalize signal DLEQ1 is also brought to the L level. In response to this, transistors 71 and 72 are both turned off. As a result, input/output data line pair BUS1, $\overline{BUS1}$ is not supplied with internally generated voltage V1, and consequently brought to a complete floating state wherein the data line pair is not supplied with electric charge at all.

Then, a column select signal indicating a column address is applied to all memory cell arrays 1a–1c . . . configuring memory block 1. As a result, data of the column address is read out from all memory cell arrays 1a–1c . . .

One memory cell array represented by memory cell array 1a, for example, includes capacitors corresponding to a plurality of column select signals CS10–CS1N applied to memory block 1.

Therefore, if column select signal CS10 indicating column address=0 is selected, for example, transistor 29a is turned on, and the potential of bit line $\overline{BL1a}$ is changed due to electric charge stored in capacitor 28a.

As a result, a small potential difference is generated between bit line BL1a having the potential unchanged from the initial charge state and bit line $\overline{BL1a}$ having the potential changed.

Then, sense signals S10, S11 are applied. In response to this, transistors 26a–26c and 27a–27c configuring sense amplifier circuit SA are operated. As a result, the generated small potential difference is amplified by sense amplifier circuit SA, and consequently one of bit lines BL1a, $\overline{BL1a}$ is charged to the H level (VCC) and the other is discharged to the L level (GND). Bit line pairs of all memory cell arrays 1a–1c . . . are charged/discharged similar to the above.

Memory block 1 repeats such a selected state and non-selected state as described above alternately depending on whether it is selected or not in response to an external address input.

Memory block 2 operates similar to memory block 1.

What is important here is that ½ VCC is used as internally generated voltage V2 determining the initial charge potential of a bit line pair when memory blocks 1 and 2 are in a non-selected state in operation of the conventional memory cell array.

This is because ½ VCC is less likely to be affected by noise of the power supply source (VCC, GND), and because current consumption is low when ½ VCC is used for initial charge.

As described above, memory blocks 1 and 2 are independent memory blocks which can be selectively operated.

Description will now be given of actual operation of reading data externally from memory block 1 in the DRAM shown in FIG. 4.

When a predetermined column address is selected in response to an external address input, memory block 1 having the column address is selected. As a result, data of a capacitor corresponding to column address=0 is read out in all memory cell arrays 1a–1c . . . based on column select signal CS10. The read data is amplified by sense amplifier circuit SA.

In response to data line equalize signal DLEQ1 attaining the L level, input/output data line pair BUS1, $\overline{BUS1}$ is not supplied with internally generated voltage V1, and brought to a floating state.

After that, a row address is selected in response to an external address input. Therefore, a row select signal corresponding to the row address is selected by row selector 8, and brought to the H level. Description is given here on the assumption that a row select signal RSb is selected.

In row selector 8, bit line pair BL1b, $\overline{BL1b}$ of memory cell array 1b corresponding to the row address of row select signal RSb out of all memory cell arrays 1a–1c . . . amplifying data corresponding to column address=0 and input/output data line pair BUS1, $\overline{BUS1}$ are connected in response to row select signal RSb.

As a result, one of the input/output data lines is charged to the H level (VCC) and the other is discharged to the L level (GND) by sense amplifier circuit SA in memory cell array 1b, whereby data is read out.

When memory block 1 is in a selected state in such reading of data, memory block 2 which is not selected is always in a non-selected state. Therefore, in this case, respective bit line pairs BL2a, $\overline{BL2a}$–BL2c, $\overline{BL2c}$ of memory cell arrays 2a–2c and input/output data line pair BUS2, $\overline{BUS2}$ in memory block 2 are always initially charged.

What is characteristic in such a conventional DRAM is that not only a bit line pair of a memory block in a selected state but also a bit line pair of a memory block in a non-selected state is connected to an input/output data line pair in response to row select signals RSa–RSc generated by row selector 8.

In the conventional case, internally generated voltage V2 for initial charge of a bit line pair is the same as internally generated voltage V1 for initial charge of an input/output data line pair.

Description will now be given of the case where there is a potential difference between internally generated voltages V1 and V2.

More specifically, description will be given on the assumption that initial charge potential v1 of an input/output data line pair is set higher than initial charge potential V2 of a bit line pair (for example, the case where each bit line pair is set to ½ VCC, and each input/output data line pair is set higher than ½ VCC).

In this case, in selected memory block 1, before select signal CS10 is selected, the bit line pair is not supplied with internally generated voltage V2 and data has been already amplified by sense amplifier circuit SA in each of memory cell arrays 1a–1c . . . , as described above.

In response to data line equalize signal DLEQ1 attaining the L level, input/output data line pair BUS1, $\overline{BUS1}$ is not supplied with internally generated voltage V1, and brought to a floating state.

Therefore, when bit line pair BL1b, $\overline{BL1b}$ and input/output data line pair BUS1, $\overline{BUS1}$ are connected because of on operation of transistors 3b, 4b in response to row select signal RSb, for example, sense amplifier circuit SA causes only a current charging/discharging electric charge of input/output data line pair BUS1, $\overline{BUS1}$ in a floating state to flow.

In this case, since memory block 2 is in a non-selected state, however, both bit line pair equalize signal BLEQ2 and data line pair equalize signal DLEQ2 are at the H level.

Since transistors 5b, 6b are turned on in this case, internally generated voltage V1 is still supplied to input/output data line pair BUS2, $\overline{BUS2}$. Internally generated voltage V2 is still-supplied to bit line pairs BL2a, $\overline{BL2a}$–BL2c,$\overline{BL2c}$ . . .

Therefore, while row select signal RSb is selected, for example, a potential difference between internally generated voltages V1 and V2 causes a current to flow. As a result, current consumption is increased.

In order to prevent such current flow, both data line equalize signal DLEQ2 and bit line pair equalize signal BLEQ2 are brought to the L level also in memory block 2 while memory block 1 is selected. As a result, bit line pairs BL2a, $\overline{BL2a}$–BL2c, $\overline{BL2c}$ . . . and input/output data line pair BUS2, $\overline{BUS2}$ are not supplied with internally generated voltages V1 and V2, respectively.

As described above, input/output data line pair BUS2, $\overline{BUS2}$ and bit line pairs BL2a, $\overline{BL2a}$–BL2c, $\overline{BL2c}$ . . . in memory block 2 are kept in a floating state at respective initial charge potentials.

As a result, when a row select signal is selected, such a current as described above will not flow in a memory block in a non-selected state.

Since input/output data line pair BUS2, $\overline{BUS2}$ and bit line pairs BL2a, $\overline{BL2a}$–BL2c, $\overline{BL2c}$ . . . in a floating state at different initial charge potentials are connected, electric charge is averaged between these line pairs, thereby bringing these line pairs to the same potential.

In such a condition, during a period from end of operation of a selected memory block to start of the next operation, the bit line pair must be again charged to the potential of ½ VCC, and the input/output data line pair must be initially charged to the potential higher than ½ VCC. Therefore, current consumption is increased.

Further, in such a case, every time any of row select signals RSa–RSc . . . is selected, the potential of a bit line pair of a memory block in a non-selected state corresponding to the selected row is changed under the influence of the input/output data line pair.

Further, as shown in FIG. 5, the bit line pair is connected to a capacitor storing data only through a transfer gate transistor. Therefore, such inadvertent potential change of a bit line pair generates noise or the like, causing destruction of data held by the capacitor.

In such a conventional DRAM selectively operating divided memory blocks as described above, not only a bit line pair in a memory block in a selected state (block including a capacitor in which it is desired to externally input/output data) but also a bit line pair in a memory block in a non-selected state (block not including a capacitor in which it is desired to externally input/output data) is connected to an input/output data line pair in each memory block in response to respective row select signals RSa–RSc . . . generated from row selector 8.

Therefore, it was not easy to operate selectively divided memory blocks with a potential difference between the initial charge potential of each bit line pair (conventionally ½ VCC) and the initial charge potential of each input/output data line pair connected thereto.

SUMMARY OF THE INVENTION

One object of the present invention is to provide a semiconductor memory device which can selectively operate a plurality of divided memory blocks with a potential difference between the initial charge potential of each bit line pair and the initial charge potential of each input/output data line pair.

The semiconductor memory device according to one aspect of the present invention includes a plurality of memory blocks, a first row selecting circuit, and a second row selecting circuit. The plurality of memory blocks each include a plurality of memory cell arrays, a plurality of bit line pairs, a plurality of switching circuits, and an input/output data line pair.

The plurality of memory blocks have common row addresses, and are operated selectively.

The plurality of bit line pairs, provided corresponding to the plurality of memory cell arrays, correspond to the plurality of common row addresses.

The plurality of switching circuits are provided corresponding to the plurality of bit line pairs. The input/output data line pair is connected to the plurality of bit line pairs through the plurality of switching circuits.

The first row selecting circuit generates a row select signal for selecting a row address.

The second row selecting circuit receives a memory block select signal indicating a selected memory block and the row select signal, and, in response to these signals, controls to turn on a switching circuit corresponding to the selected row address in the selected memory block.

As described above, the second row selecting circuit turns on a switching circuit corresponding to the selected row address in the selected memory block.

Therefore, in the selected memory block, a bit line pair corresponding to the selected row address and the input/output data line pair are connected. On the other hand, in a non-selected memory block, a bit line pair corresponding to the selected row address and the input/output data line pair are not connected.

Therefore, for a plurality of memory blocks having common row addresses, a row address can be selected for every memory block.

As a result, it is possible to selectively operate divided memory blocks with a potential difference between the initial charge potential of each bit line pair and the initial charge potential of each input/output data line pair.

Alternatively, in a memory block in a non-selected state, a bit line pair may be initially charged to a first potential, and an input/output data line pair may be initially charged to a second potential higher than the first potential.

The semiconductor memory device according to another aspect of the present invention includes a plurality of memory blocks, a first row selecting circuit, and a plurality of second row selecting circuits. The plurality of memory blocks each include a plurality of memory cell arrays, a plurality of bit line pairs, a plurality of switching circuits, and an input/output data line pair.

The plurality of memory blocks have a plurality of common row addresses, and are selectively operated.

The plurality of bit line pairs, provided corresponding to the plurality of memory cell arrays, correspond to the plurality of common row addresses, respectively.

The plurality of switching circuits are provided corresponding to the plurality of bit line pairs. The input/output data line pair is connected to the plurality of bit line pairs through the plurality of switching circuits.

The first row selecting circuit generates a row select signal for selecting a row address for every row address.

The plurality of second row selecting circuits are provided corresponding to the plurality of common row addresses. The plurality of second row selecting circuits each receive a memory block select signal indicating a selected memory block and a corresponding row select signal, and, in response to these signals, control to turn on a switching circuit corresponding to the selected row address in the selected memory block.

As described above, the plurality of second row selecting circuits each turn on a corresponding switching circuit in the selected memory block when a corresponding row address is selected.

Therefore, in the selected memory block, a bit line pair corresponding to the selected row address and the input/output data line pair are connected. On the other hand, in a non-selected memory block, a bit line pair corresponding to the selected row address and the input/output data line pair are not connected.

Therefore, for the plurality of memory blocks having the common row addresses, a row address can be selected for every memory block.

As a result, it is possible to selectively operate divided memory blocks with a potential difference between the initial charge potential of each bit line pair and the initial charge potential of each input/output data line pair.

Alternatively, in a memory block in a non-selected state, a bit line pair may be initially charged to a first potential, and an input/output data line pair may be initially charged to a second potential higher than the first potential.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A–6F collectively constitute a timing chart of data reading operation in the conventional DRAM.

DESCRIPTION OF THE PREFERRED EMBODIMENTS

The embodiment of the present invention will now be described in detail with reference to the drawings.

Figure 1:
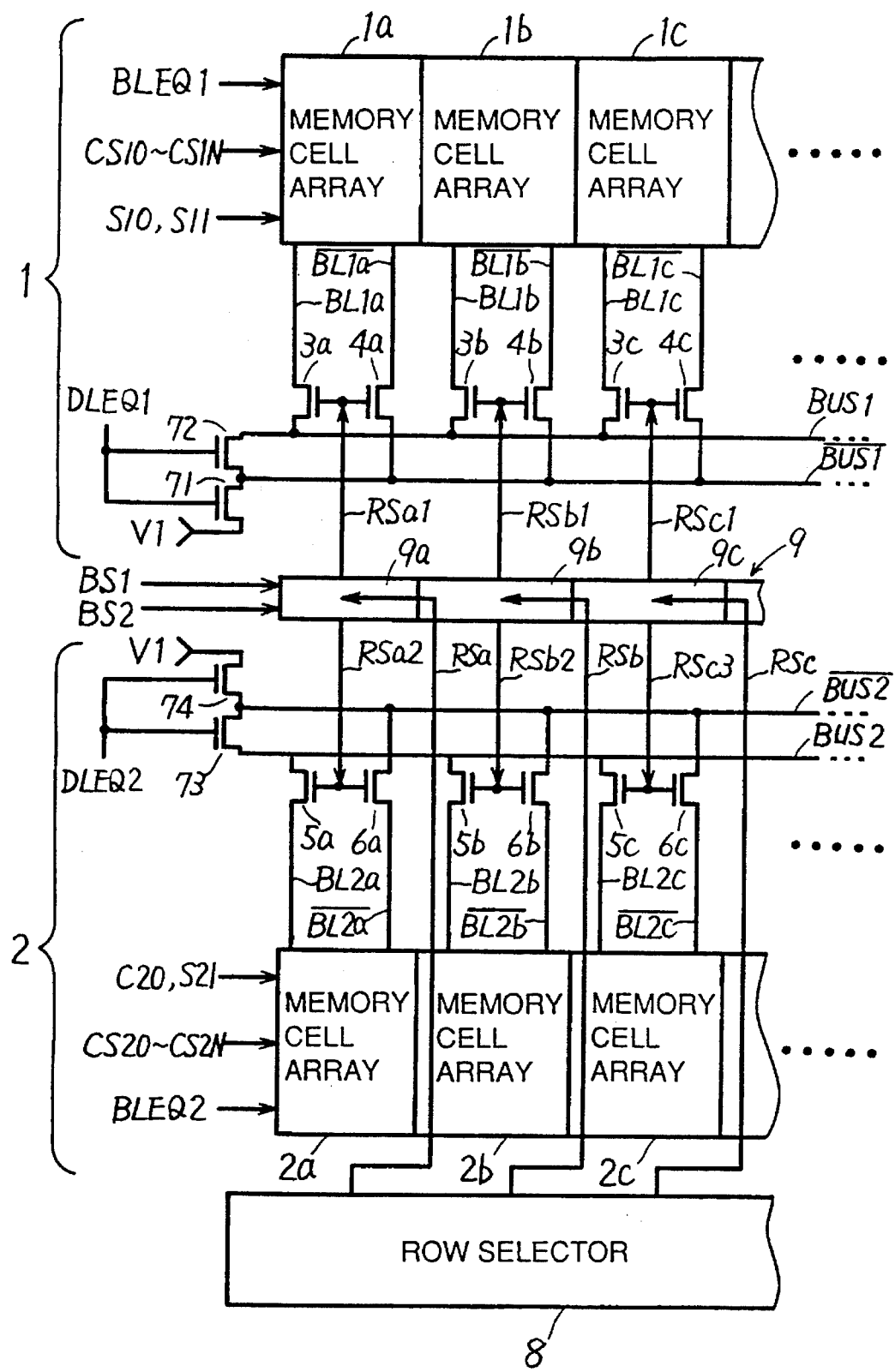
FIG. 1 is a diagram of a circuit showing a configuration of the DRAM according to one embodiment of the present invention.

FIG. 1 is a diagram of a circuit showing the configuration of the DRAM according to the embodiment of the present invention. In FIG. 1, portions corresponding to those of FIG. 4 are labeled with the same reference characters, and the description thereof will not be repeated.

Figure 4:
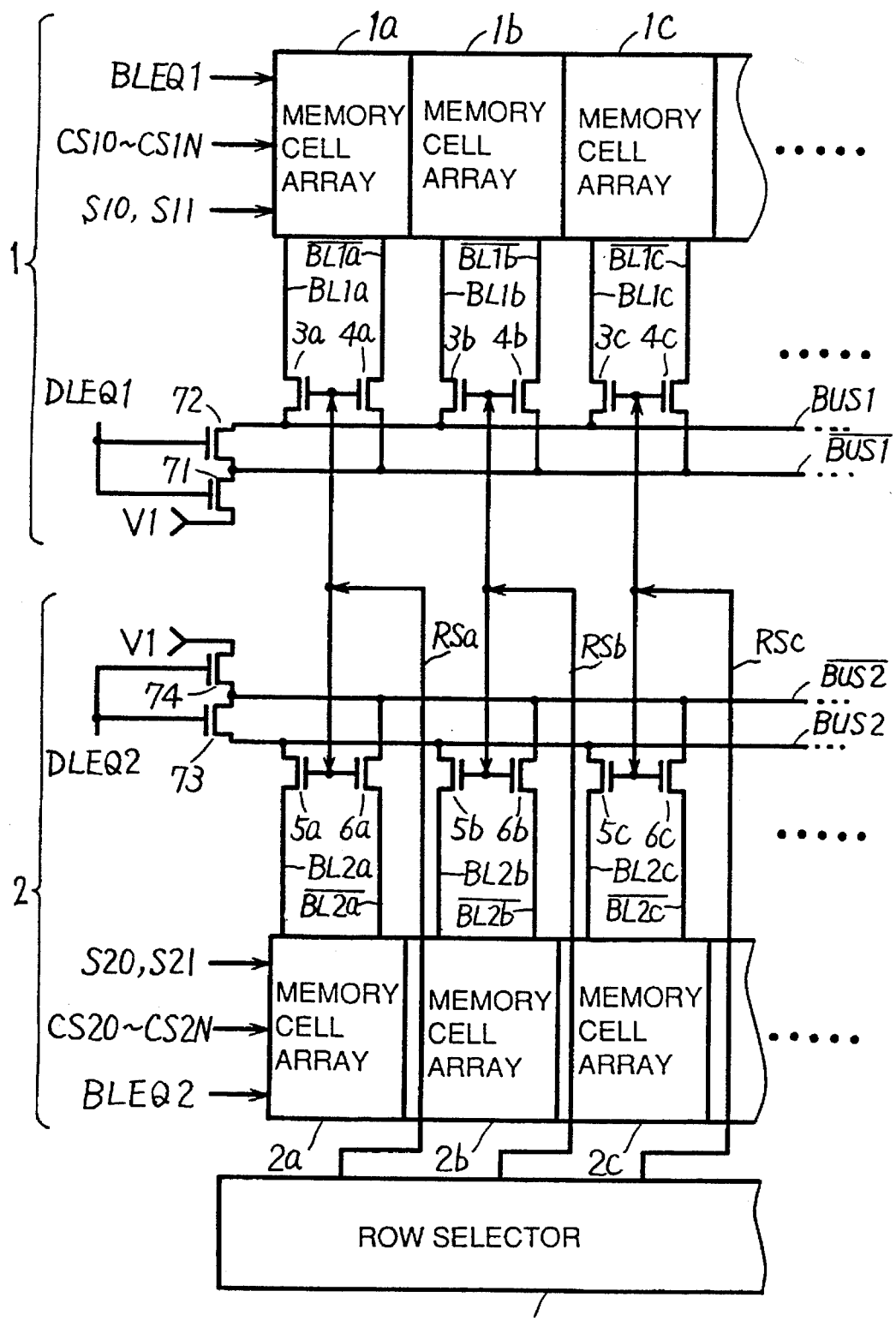
FIG. 4 is a block diagram of a circuit showing a configuration of the conventional DRAM.

The DRAM of FIG. 1 is different from that of FIG. 4 in that a sub row selector 9 is provided. Except for that, the DRAM of FIG. 1 is the same as that of FIG. 4.

Sub row selector 9 includes a plurality of selectors 9a–9c . . . Selectors 9a–9c . . . are provided corresponding to respective row addresses of memory blocks 1 and 2. Therefore, selectors 9a–9c . . . each have a function as an independent sub row selector.

Selectors 9a–9c . . . each receive memory block select signals BS1 and BS2. Memory block select signal BS1 indicates that memory block 1 has been selected. Memory block select signal BS2 indicates that memory block 2 has been selected. In addition to these signals, selectors 9a–9c . . . receive corresponding row select signals RSa–RSc . . . , respectively.

In response to the plurality of input signals, selectors 9a–9c each provide a sub row select signal to the gates of transfer gate transistors of bit line pairs of corresponding row addresses of memory blocks 1 and 2.

More specifically, selector 9a, for example, provides a sub row select signal RSa1 to respective gates of transistors 3a and 4a of memory block 1, and a sub row select signal RSa2 to respective gates of transistors 5a and 6a of memory block 2.

When a corresponding row address is selected, only one of sub row select signals RSa1 and RSa2 which is applied to a selected memory block attains the H level, and the other of sub row select signals RSa1 and RSa2 which is applied to a non-selected memory block attains the L level.

This is true of sub row select signals RSb1, RSb2, RSc1, RSc2 . . . provided from the other selectors 9b, 9c . . .

Figure 2:
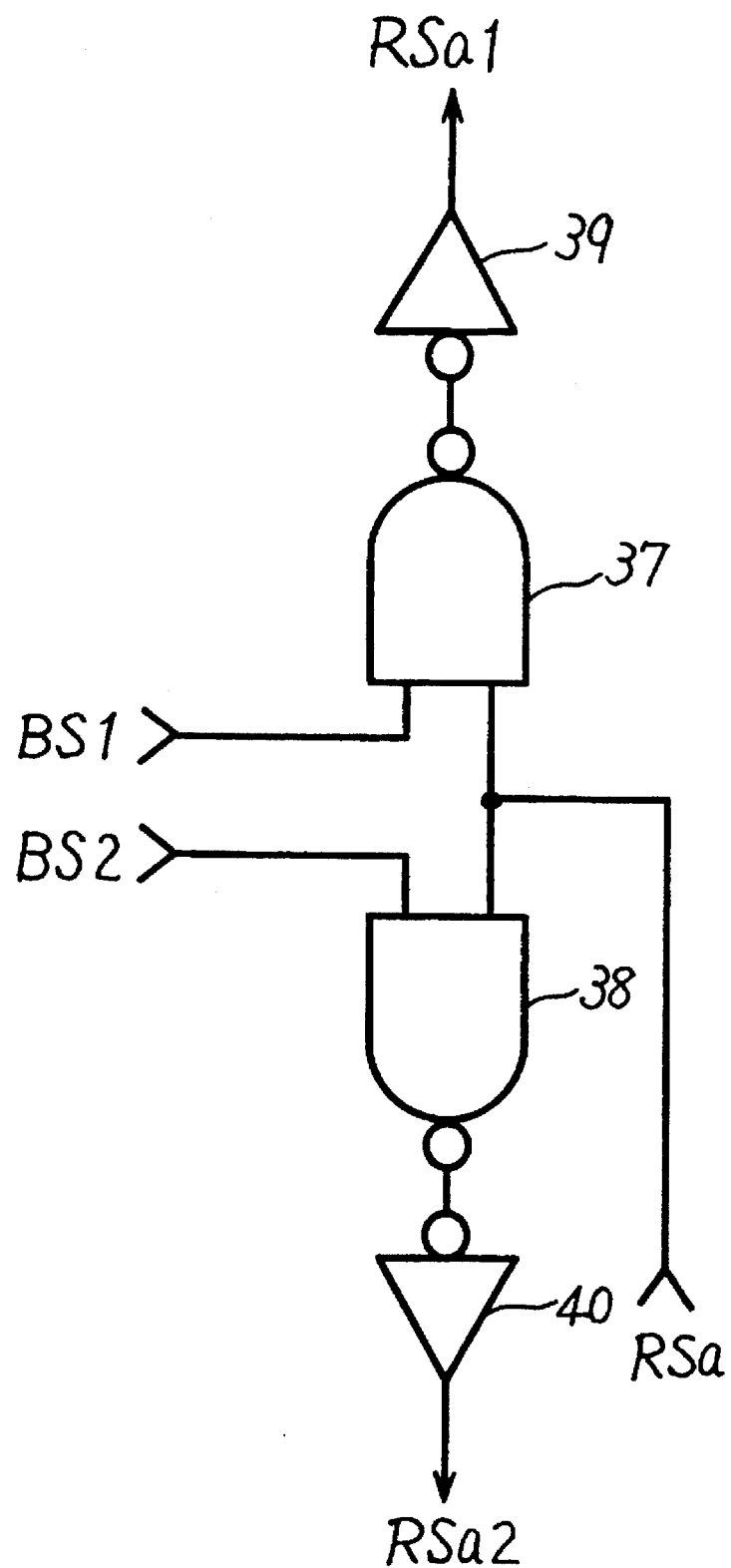
FIG. 2 is a diagram showing a circuit of a configuration of a selector in a sub row selector.
Figure 3:
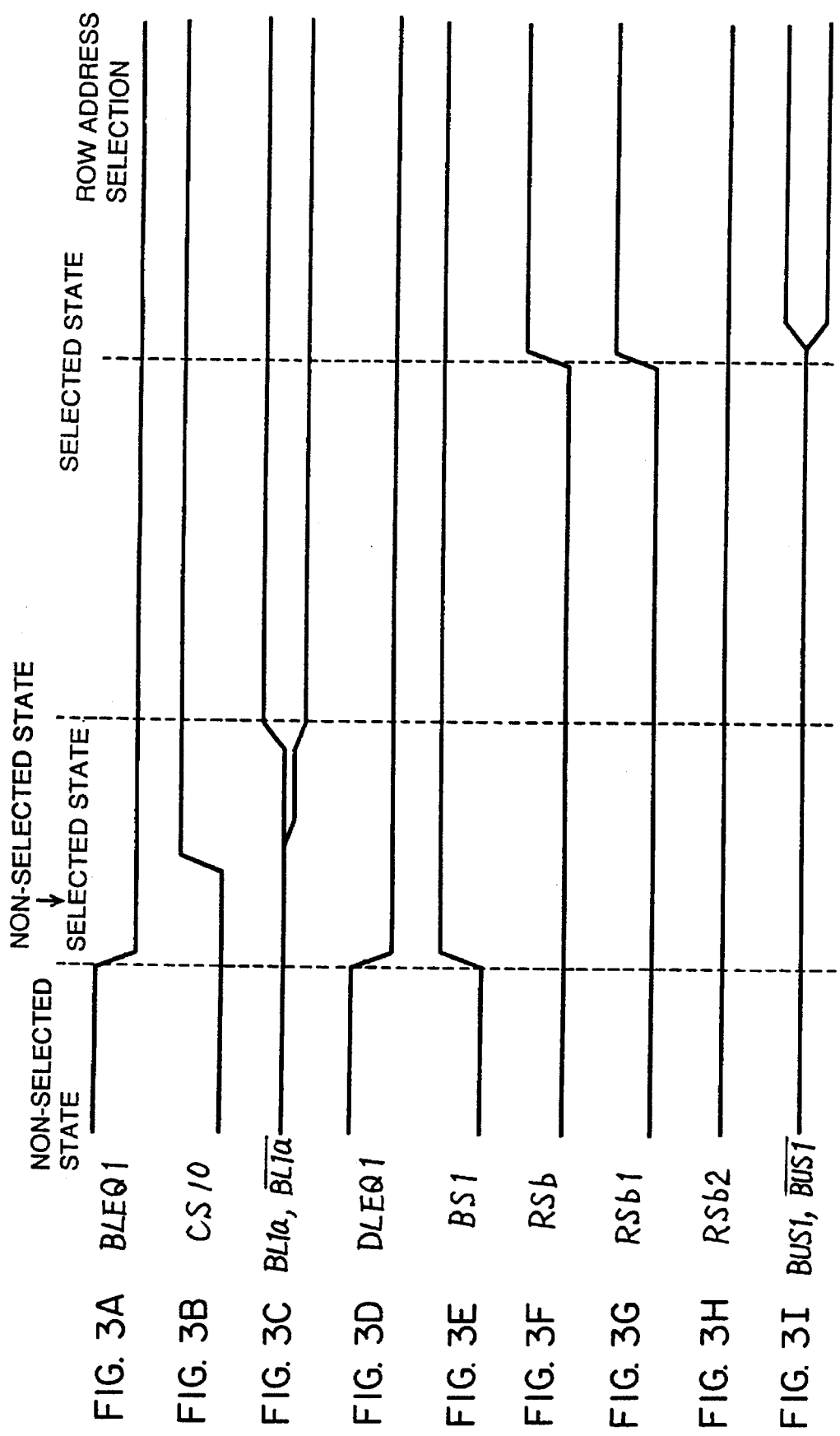
FIGS. 3A–3I collectively constitute a timing chart showing data reading operation when a memory block of FIG. 1 is selected.

Description will now be given of a detailed configuration of selectors 9a–9c . . . in sub row selector 9. These selectors have the same configuration. Therefore, description will be given of selector 9a. FIG. 2 is a circuit diagram showing the configuration of selector 9a.

Referring to FIG. 2, the selector includes NAND circuits 37, 38 and NOT circuits 39, 40.

NAND circuit 37 receives memory block select signal BS1 and row select signal RSa as input signals, and provides an output signal in response to these Signals through NOT circuit 39. The output signal of NAND circuit 37 is inverted by NOT circuit 40, and formed into sub row select signal RSa1.

NAND circuit 38 receives block select signal BS2 and row select signal RSa as input signals, and provides an output signal in response to these signals through NOT circuit 40. The output signal of NAND circuit 38 is inverted by NOT circuit 40, and is formed into sub row select signal RSa2.

Because of such a circuit configuration, when memory block select signal BS1 and row select signal RSa are both at the H level, sub row select signal RSa1 attains the H level. When memory block select signal BS2 and row select signal RSa are both at the H level, sub row select signal RSa2 attains the H level.

Operation of the DRAM shown in FIGS. 1 and 2 will now be described.

Operation when one of memory blocks 1 and 2 is selected is the same as the conventional case. More specifically, when one memory block is selected in response to an external address input, data corresponding to a selected column address is read out in bit line pairs of all memory cell arrays included in the memory block, and the read data is amplified for output.

Operation of reading data externally from memory block 1 in the DRAM of FIG. 1 will be described.

FIGS. 3A–3I collectively constitute a timing chart showing reading operation when memory block 1 is selected.

The timing chart of FIGS 3A–3I are different from that of FIGS. 6A–6F in that memory block select signal BS1 attains the H level when memory block 1 is selected, and that sub row select signal RSb1 then attains the H level by row select signal RSb attaining the H level.

Figure 5:
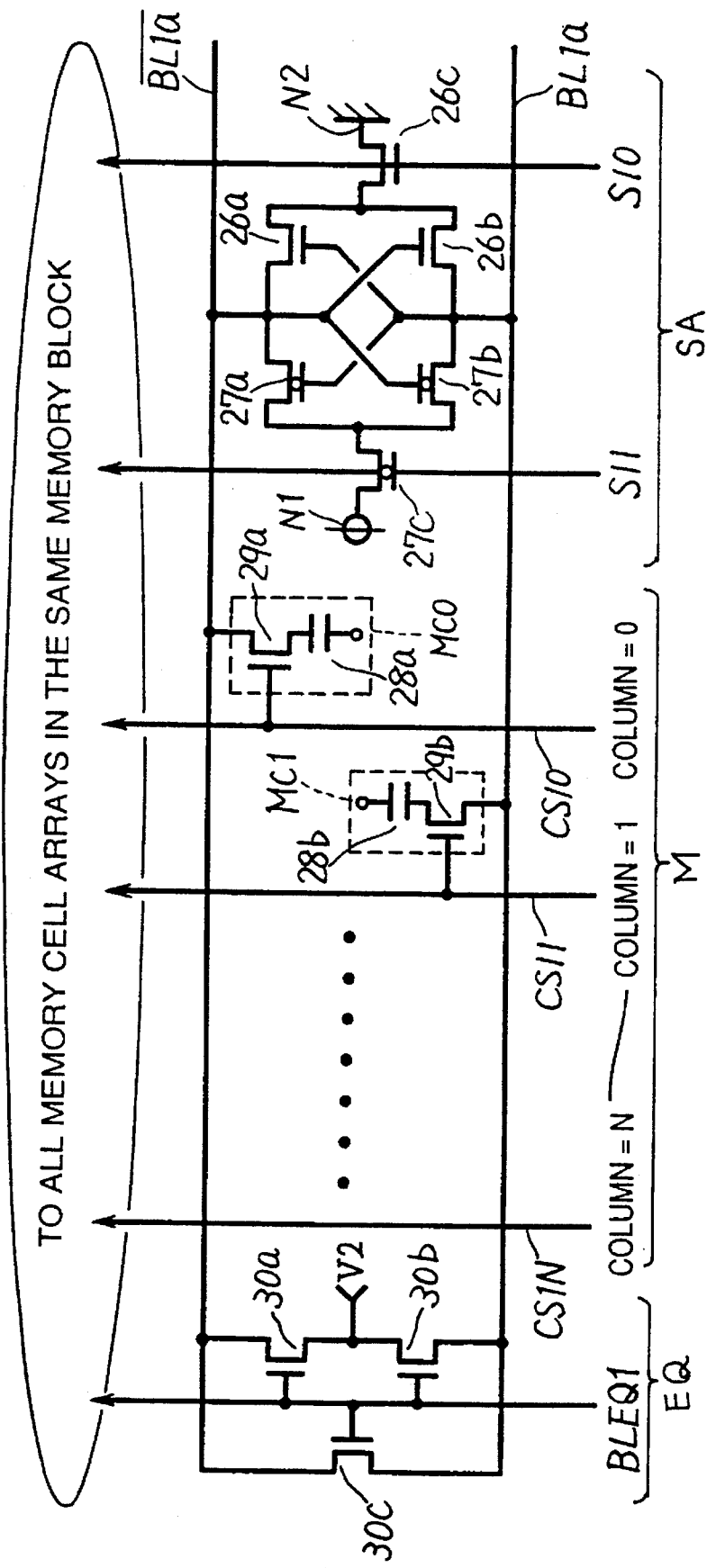
FIG. 5 is a diagram of a circuit showing a configuration of the memory cell array of FIG. 4.

When column address=0 is selected in response to an external address input, memory block 1 corresponding to the column address is selected. As a result, data of capacitors corresponding to column address=0 in all memory cell arrays 1a–1c . . . of memory block 1 is read out to corresponding bit line pairs. Then, the data is amplified by such a sense amplifier circuit SA as shown in FIG. 5.

Simultaneously, in response to data line pair equalize signal DLEQ1 attaining the L level, input/output data line pair BUS1, $\overline{BUS1}$ is brought to a floating state wherein the line pair is not supplied with internally generated voltage V2.

In addition, what is characteristic in the present invention is that memory block select signal BS1 indicating that memory block 1 is now selected attains the H level.

When these operations are complete, data is transmitted to input/output data line pair BUS1, $\overline{BUS1}$ through a corresponding transfer gate transistor from a bit line pair of a memory cell array corresponding to a row address selected in response to sub row select signals RSa1–RSc1 . . . , out of memory cell arrays 1a–1c.

What is the most characteristic in the present invention is the configuration and operation relating to such selection of a row address.

Selectors 9a–9c . . . in sub row selector 9 each have a function of separately transmitting row select signals RSa–RSc . . . generated by row selector 8 to memory blocks 1 and 2 in response to memory block select signals BS1 and BS2.

Similar to the conventional case, row selector 8 generates row select signals RSa–RSc . . . On the other hand, sub row selector 9 connects through a corresponding transfer gate transistor a bit line pair of a memory cell array corresponding to a selected row address in a selected memory block and an input/output data line pair in response to sub row select signals RSa1–RSc1 . . . and RSa2–RSc2 . . . generated by respective selectors. As a result, data from the memory cell arrays is read out to the outside world.

More specifically, when a row address corresponding to memory cell arrays 1a and 2a is selected when memory block 1 is selected, for example, only transistors 3a and 4a of memory block 1 are turned on, and transistors 5a and 6a of memory block 2 are not turned on.

Therefore, in memory block 2 in a non-selected state, bit line pair BL2a, $\overline{BL2a}$ corresponding to the selected row address is not connected to input/output data line pair BUS2, $\overline{BUS2}$.

As a result, in a non-selected memory block, the initial charge potential of a bit line pair and the initial charge potential of an input/output data line pair are respectively held. Therefore, it is not necessary to initially charge the line pairs again, unlike the conventional case.

As described above, in this embodiment, it is possible to selectively operate memory blocks 1 and 2 always with a potential difference between the initial charge potential of a data line pair and the initial charge potential of an input/output data line pair in a non-selected memory block.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a plurality of memory blocks having a plurality of common row addresses and being operated selectively,
said plurality of memory blocks each including
a plurality of memory cell arrays,
a plurality of bit line pairs provided corresponding to said plurality of memory cell arrays and corresponding to said plurality of common row addresses,
a plurality of switching means provided corresponding to said plurality of bit line pairs, and
an input/output data line pair connected to said plurality of bit line pairs through said plurality of switching means;
first row selecting means for generating a row select signal selecting a common row address; and
second row selecting means receiving a memory block select signal indicating selected said memory block and said row select signal, and responsive to these signals for turning on said switching means corresponding to the selected row address in the selected memory block.

2. The semiconductor memory device as recited in claim 1, wherein
said plurality of bit line pairs are initially charged to a first potential when a corresponding memory block is in a non-selected state, and
said input/output data line pair is initially charged to a second potential higher than said first potential when a corresponding memory block is in a non-selected state.

3. The semiconductor memory device as recited in claim 1, wherein
said plurality of memory blocks each further include
first equalize means provided corresponding to said plurality of bit line pairs for equalizing corresponding said bit line pair to a first potential when corresponding said memory block is in a non-selected state, and
second equalize means for equalizing corresponding said input/output data line pair to a second potential higher than said first potential.

4. The semiconductor memory device as recited in claim 3, wherein said plurality of memory blocks each further include sense amplifier means provided corresponding to said plurality of bit line pairs for sensing and amplifying a potential difference of corresponding said bit line pair when corresponding said memory block is in a selected state.

5. The semiconductor memory device as recited in claim 4, wherein said plurality of memory cell arrays each include a plurality of dynamic type memory cells.

6. A semiconductor memory device, comprising:

a plurality of memory blocks having a plurality of common row addresses and being operated selectively, said plurality of memory blocks each including
  a plurality of memory cell arrays,
  a plurality of bit line pairs provided corresponding to said plurality of memory cell arrays and corresponding to said plurality of common row addresses,
  a plurality of switching means provided corresponding to said plurality of bit line pairs, and
  an input/output data line pair connected to said plurality of bit line pairs through said plurality of switching means;

first row selecting means for generating a row select signal for selection one of said common row addresses; and a plurality of second row selecting means provided corresponding to said plurality of common row addresses and each receiving a memory block select signal indicating a selected memory block and corresponding said row select signal, for turning on said switching means corresponding to the selected common row address in the selected memory block in response to these signals.

7. The semiconductor memory device as recited in claim 6, wherein said plurality of bit line pairs are initially charged to a first potential when a corresponding memory block is in a non-selected state, and said input/output data line pair is initially charged to a second potential higher than said first potential when the corresponding memory block is in a non-selected state.

8. The semiconductor memory device as recited in claim 6, wherein said memory block select signal is formed of a plurality of block select signals corresponding to said plurality of memory blocks, a signal corresponding to a selected memory block among the block select signals being activated, each of said row select signals is activated when a corresponding row address is selected, and said plurality of second row selecting means each include a plurality of logic means provided corresponding to said plurality of memory blocks for each providing a logic signal turning on said switching means of corresponding said memory block when corresponding said block select signal and corresponding said row select signal are both activated.

9. The semiconductor memory device as recited in claim 8, wherein said plurality of memory blocks each include first equalize means provided corresponding to said plurality of bit line pairs for equalizing corresponding said bit line pair to a first potential when corresponding said memory block is in a non-selected state, and second equalize means for equalizing corresponding said input/output data line pair to a second potential higher than said first potential.

10. The semiconductor memory device as recited in claim 9, wherein said plurality of memory blocks each further include sense amplifier means provided corresponding to said plurality of bit line pairs for sensing and amplifying a potential difference of corresponding said bit line pair when corresponding said memory block is in a selected state.

11. The semiconductor memory device as recited in claim 10, wherein said plurality of memory cell arrays each include a plurality of dynamic type memory cells.

* * * * *